US008461621B2

(12) United States Patent
Chuang et al.

(10) Patent No.: US 8,461,621 B2
(45) Date of Patent: Jun. 11, 2013

(54) METHOD AND APPARATUS OF FORMING BIPOLAR TRANSISTOR DEVICE

(75) Inventors: Harry Hak-Lay Chuang, Hsinchu (TW); Lee-Wee Teo, Singapore (SG); Ming Zhu, Singapore (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 178 days.

(21) Appl. No.: 12/720,504

(22) Filed: Mar. 9, 2010

(65) Prior Publication Data

US 2011/0220963 A1    Sep. 15, 2011

(51) Int. Cl.
*H01L 27/06* (2006.01)
*H01L 21/8249* (2006.01)

(52) U.S. Cl.
USPC ............... 257/140; 257/163; 257/E27.015; 257/E21.696; 438/135

(58) Field of Classification Search
None
See application file for complete search history.

(56) References Cited

U.S. PATENT DOCUMENTS

| 4,962,053 A * | 10/1990 | Spratt et al. ............. 438/202 |
| 5,175,606 A * | 12/1992 | Tsai et al. ............. 257/370 |
| 5,218,228 A * | 6/1993 | Williams et al. ............. 257/593 |
| 5,391,503 A * | 2/1995 | Miwa et al. ............. 438/349 |
| 5,525,530 A * | 6/1996 | Watabe ............. 438/234 |
| 5,670,396 A * | 9/1997 | Shibib ............. 438/236 |
| 5,943,564 A * | 8/1999 | Chen et al. ............. 438/202 |
| 6,004,840 A * | 12/1999 | Kimura et al. ............. 438/234 |
| 6,030,864 A * | 2/2000 | Appel et al. ............. 438/234 |
| 6,255,713 B1 * | 7/2001 | Chi ............. 257/526 |
| 6,414,370 B1 * | 7/2002 | Nagasu et al. ............. 257/575 |
| 6,724,050 B2 * | 4/2004 | Salling et al. ............. 257/362 |
| 6,737,721 B1 * | 5/2004 | Suzuki ............. 257/500 |
| 2001/0000288 A1 * | 4/2001 | Oh ............. 257/409 |
| 2001/0013610 A1 * | 8/2001 | Chi et al. ............. 257/197 |
| 2005/0167753 A1 * | 8/2005 | Mallikarjunaswamy et al. ............. 257/360 |
| 2006/0131693 A1 * | 6/2006 | Kim ............. 257/565 |
| 2009/0283825 A1 * | 11/2009 | Wang et al. ............. 257/335 |
| 2010/0001369 A1 * | 1/2010 | Chuang et al. ............. 257/526 |

OTHER PUBLICATIONS

"Chapter 7." On-chip ESD Protection for Integrated Circuits an IC Design Perspective. Boston, MA: Kluwer Academic, 2002.*
Ker, M.-D., and K.-C. Hsu. "SCR Device Fabricated With Dummy-Gate Structure to Improve Turn-On Speed for Effective ESD Protection in CMOS Technology." IEEE Transactions on Semiconductor Manufacturing 18.2 (2005): 320-27.*
Chapter 7. On-chip ESD Protection for Integrated Circuits an IC Design Perspective. Boston, MA: Kluwer Academic, 2002. (Kluwer).*

* cited by examiner

*Primary Examiner* — Thomas L Dickey
*Assistant Examiner* — Joseph Schoenholtz
(74) *Attorney, Agent, or Firm* — Haynes and Boone, LLP

(57) ABSTRACT

The present disclosure provides a semiconductor device having a transistor. The transistor includes a substrate. The transistor includes a collector region that is formed in a portion of the substrate. The transistor includes a base region that is surrounded by the collector region. The transistor includes an emitter region that is surrounded by the based region. The transistor includes an isolation structure that is disposed adjacent the emitter region. The transistor includes a gate structure that is disposed over a portion of the emitter region and a portion of the isolation structure.

20 Claims, 4 Drawing Sheets

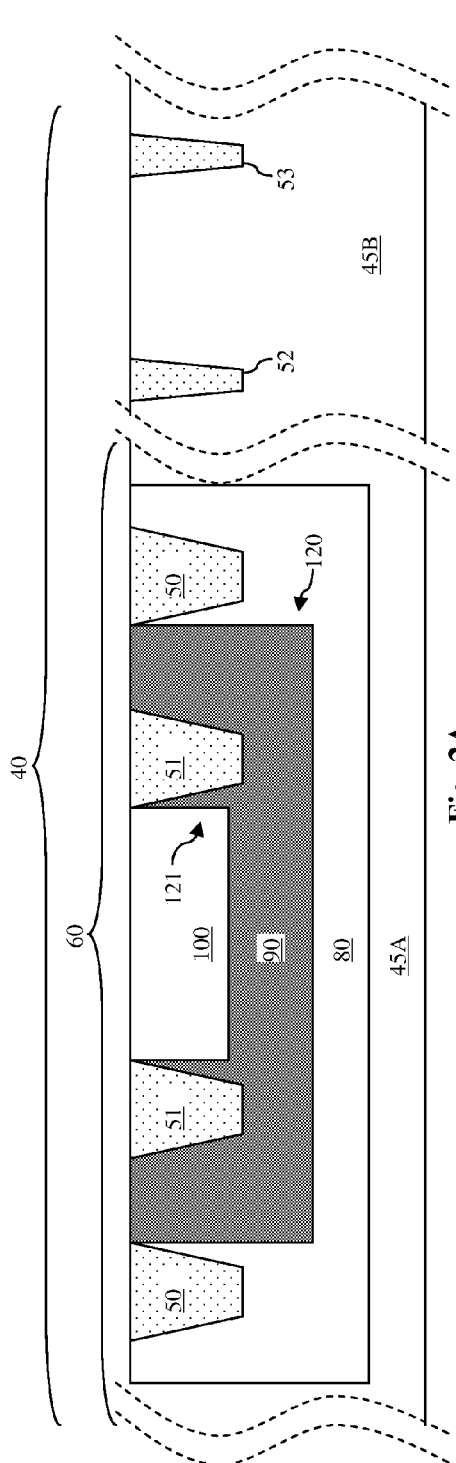
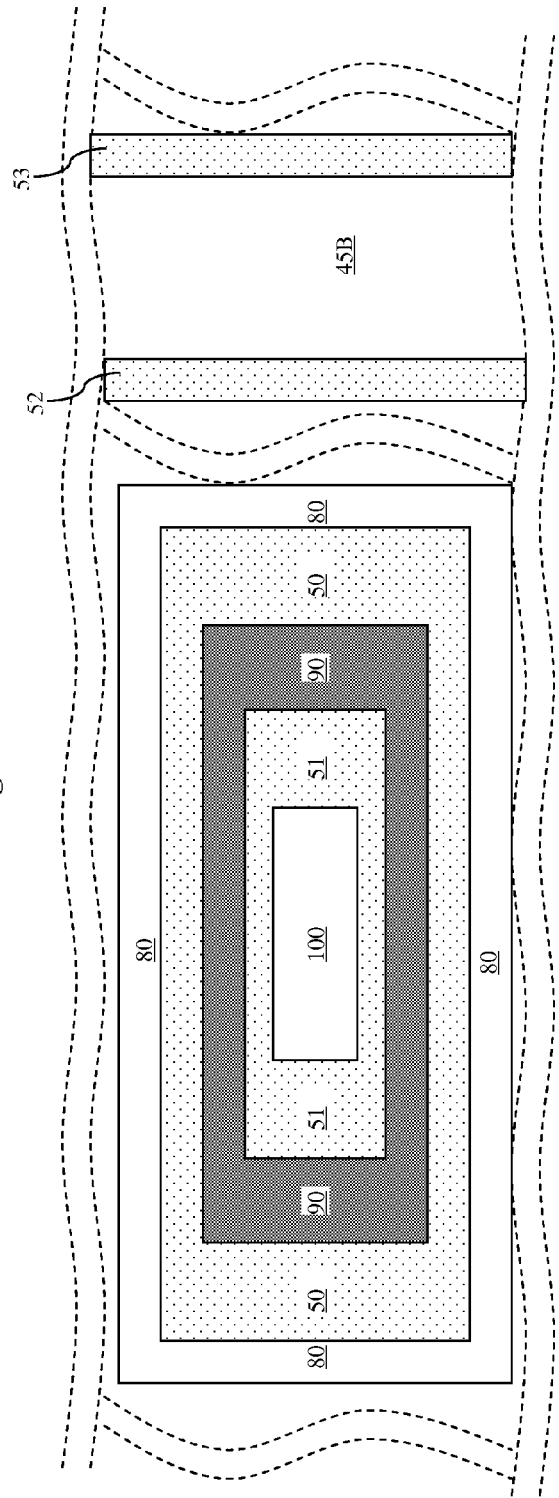
Fig. 2A
Fig. 2B

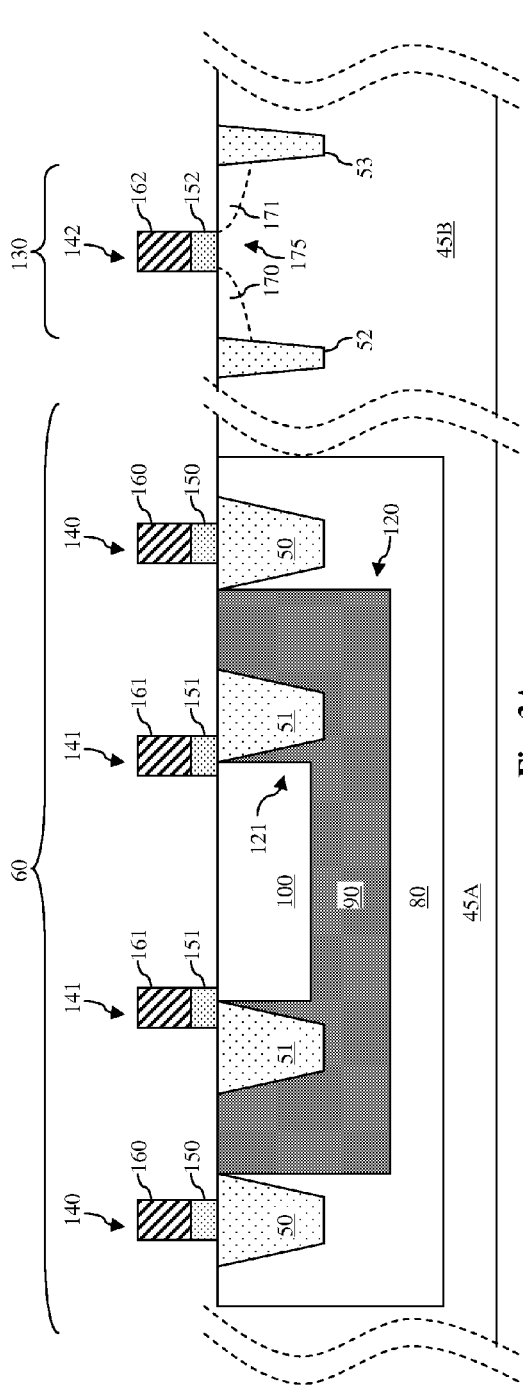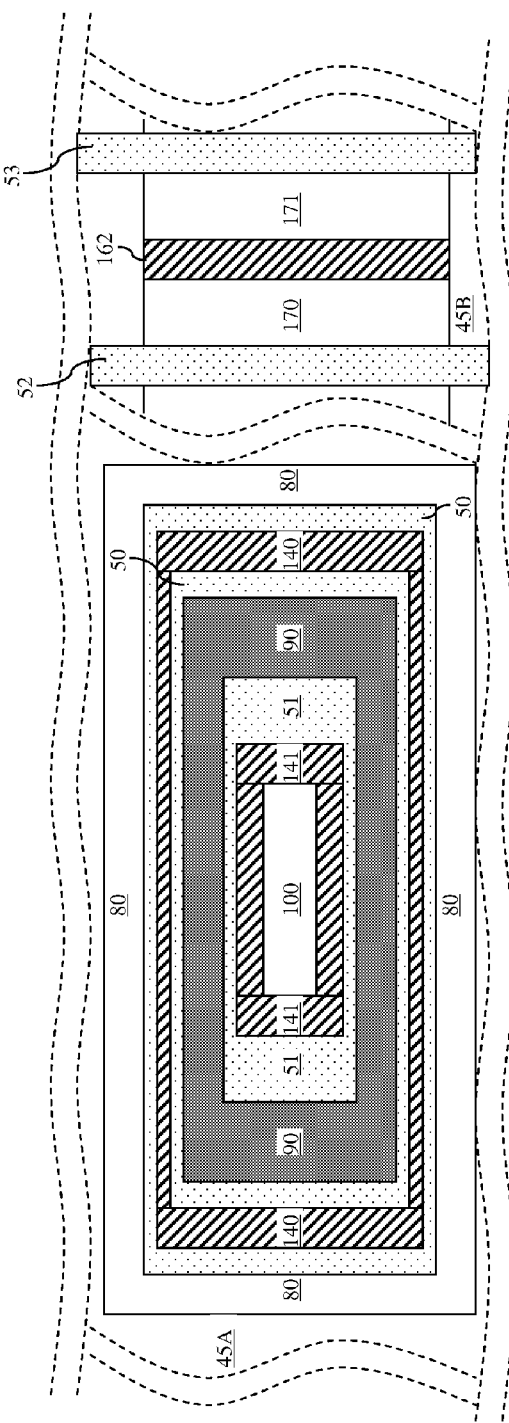
Fig. 3A
Fig. 3B

METHOD AND APPARATUS OF FORMING BIPOLAR TRANSISTOR DEVICE

TECHNICAL FIELD

The present disclosure relates generally to a method of fabricating a semiconductor device, and more particularly, to a method of forming a bipolar transistor device.

BACKGROUND

The semiconductor integrated circuit (IC) industry has experienced rapid growth. Technological advances in IC materials and design have produced generations of ICs where each generation has smaller and more complex circuits than the previous generation. Some ICs include bipolar transistor devices. The fabrication of these bipolar transistor devices may involve a silicidation process, in which silicides may be formed on the bipolar transistor devices. However, it is desirable to protect some portions of the bipolar transistor devices so that silicides are not formed on these portions. Existing methods of protecting these portions involve using a silicide blocking layer such as an oxide layer. However, forming the silicide blocking layer may require an additional fabrication process and thus may increase fabrication costs.

Therefore, while existing methods of fabricating bipolar transistor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A-4A are diagrammatic fragmentary cross-sectional side views of a semiconductor device at various stages of fabrication in accordance with an embodiment of the method of FIG. 1; and FIGS. 2B-4B are diagrammatic fragmentary top views of the semiconductor device illustrated in FIGS. 2A-4A, respectively.

SUMMARY

Figure 1:
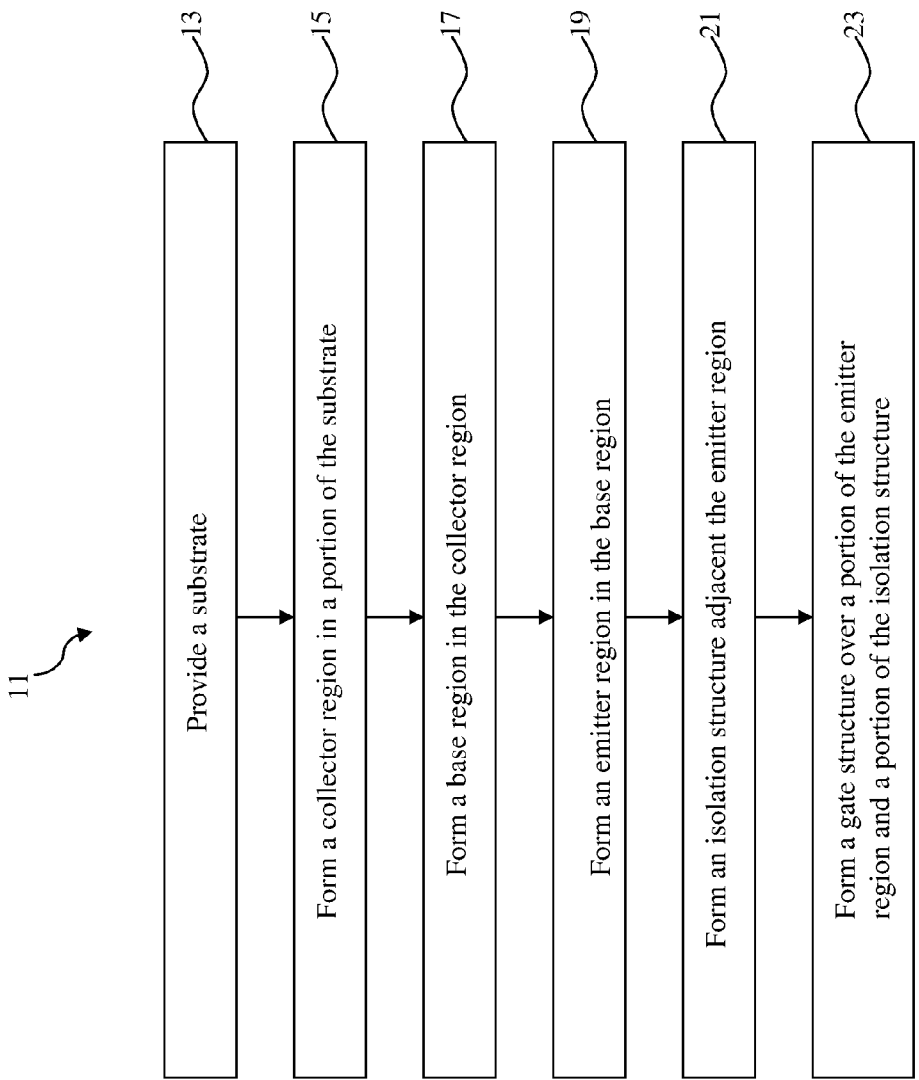
FIG. 1 is a flowchart illustrating a method of forming a semiconductor device that includes a bipolar transistor device according to various aspects of the present disclosure.

One of the broader forms of the present disclosure involves a semiconductor device that includes a transistor. The transistor includes, a substrate; a collector region disposed in a portion of the substrate; a base region surrounded by the collector region; an emitter region surrounded by the based region; an isolation structure disposed adjacent the emitter region; and a gate structure disposed over a portion of the emitter region and a portion of the isolation structure.

Another of the broader forms of the present disclosure involves a semiconductor device that includes a bipolar transistor. The bipolar transistor includes, a collector portion formed in a portion of a substrate; a base portion formed in the collector portion; an emitter portion formed in the based portion; an isolation structure formed in the base portion, the isolation structure being formed proximate the emitter region; and a gate structure formed partially over the emitter portion and partially over the isolation structure; and a gate electrode layer having one of a metal material and a polysilicon material.

Still another of the broader forms of the present disclosure involves a method of fabricating a semiconductor device. The method includes, providing a substrate; forming a collector region in a portion of the substrate; forming a base region in the collector region; forming an emitter region in the based region; forming an isolation structure adjacent the emitter region; and forming a gate structure over a portion of the emitter region and a portion of the isolation structure.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 11 for fabricating a semiconductor device. The method 11 begins with block 13 in which a substrate is provided. The method 11 continues with block 15 in a collector region is formed in the substrate. The method 11 continues with block 17 in which a base region is formed in the collector region. The method 11 continues with block 19 in which an emitter region is formed in the base region. The method 11 continues with block 21 in which an isolation structure is formed adjacent the emitter region. The method 11 continues with block 23 in which a gate structure is formed over a portion of the emitter region and a portion of the isolation structure.

FIGS. 2A-4A are diagrammatic fragmentary cross-sectional side views of one embodiment of a semiconductor at various stages of fabrication in accordance with the method 11 of FIG. 1. FIGS. 2B-4B are diagrammatic fragmentary top views of the semiconductor device illustrated in FIGS. 2A-4A, respectively. It is understood that FIGS. 2A-4A and 2B-4B have been simplified for a better understanding of the inventive concepts of the present disclosure. Accordingly, it should be noted that additional processes may be provided before, during, and after the method 11 of FIG. 1, and that some other processes may only be briefly described herein.

Referring to FIGS. 2A-2B, the semiconductor device 40 has a substrate 45. The substrate 45 is a silicon substrate doped with a P-type dopant such as boron (a P-type substrate). Alternatively, the substrate 45 could be another suitable semiconductor material. For example, the substrate 45 may be a silicon substrate that is doped with an N-type dopant such as phosphorous or arsenic (an N-type substrate). In addition, the substrate 45 could include an epitaxial layer (epi layer), may be strained for performance enhancement, and may include a silicon-on-insulator (SOI) structure.

The substrate 45 has a substrate portion 45A and a substrate portion 45B. Isolation structures 50 and 51 are formed in the substrate portion 45A, and isolation structures 52 and 53 are formed in the substrate portion 45B. In an embodiment, the isolation structures 50-53 are shallow trench isolation (STI) structures that each include a dielectric material, which may be silicon oxide or silicon nitride. The isolation structures 50-53 may be formed by etching regions of the substrate 45 to form openings and thereafter filling the openings with the dielectric material.

A bipolar transistor device 60 is formed in the substrate portion 45A through various doping and patterning processes. The bipolar transistor device 60 includes a collector region (or collector portion) 80, a base region (or base portion) 90, and an emitter region (or emitter portion) 100. In the embodiment shown in FIGS. 2A-2B, the bipolar transistor device 60 is a NPN transistor, meaning that the collector region 80 and the emitter region 100 are doped with an N-type dopant such as arsenic or phosphorous, and the base region 90 is doped with a P-type dopant such as boron. The emitter region 100 is more heavily doped compared to the collector region 80. The collector region 80 is an N-well formed in the P-type substrate portion 45A, the base region 90 is a P-well that is formed inside the N-well of the collector region 80, and the emitter region 100 is a heavily doped N-type region that is formed inside the P-well of the base region 90. Thus, a PN junction is formed at an interface 120 between the collector region 80 and the base region 90, and another PN junction is formed at an interface 121 between the base region 90 and the emitter region 100. In an alternative embodiment, the bipolar transistor device may be a PNP transistor, in which case the collector region and the emitter region are doped with a P-type dopant, and the base region is doped with an N-type dopant.

As is illustrated in the top view of FIG. 2B, the emitter region 100 is surrounded by the isolation structure 51; the isolation structure 51 is surrounded by the base region 90; the base region 90 is surrounded by the isolation structure 50; and the isolation structure 50 is surrounded by the collector region 80. Hence, the isolation structures 50 and 51 approximately define boundaries of exposed surfaces of the collector region 80, the base region 90, and the emitter region 100. Meanwhile, the isolation structures 52 and 53 define boundaries to a region of the substrate portion 45B where a metal-oxide semiconductor (MOS) transistor device 130 (shown in FIG. 3) will be formed, as discussed later in more detail. Thus, the semiconductor device 40 includes both the bipolar transistor device 60 and the MOS transistor device 130. It is understood that the semiconductor device 40 may include other bipolar transistor devices and other MOS transistor devices that are similar to the bipolar transistor device 60 and the MOS transistor device 130 (shown in FIG. 3), respectively. For the sake of simplicity, these other transistor devices are not illustrated herein.

Referring now to FIGS. 3A-3B, gate structures 140-142 are formed over the substrate 45. The gate structure 140 is disposed over a portion of the isolation structure 50, the gate structure 141 is disposed over a portion of the isolation structure 51 and a portion of the emitter region 100, and the gate structure 142 is disposed over a portion of the substrate portion 45B. The gate structures 140-142 serve as dummy gates for reasons that will be discussed below.

The gate structures 140-142 respectively include gate dielectric layers 150-152. The gate dielectric layers 150-152 each include silicon oxide. In another embodiment, the gate dielectric layers 150-152 each include a high-k dielectric material. A high-k dielectric material is a material having a dielectric constant that is greater than a dielectric constant of $SiO_2$, which is approximately 4. For example, the high-k dielectric material may include hafnium oxide ($HfO_2$), which has a dielectric constant that is in a range from approximately 18 to approximately 40. Alternatively, the high-k material may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof.

The gate structures 140-142 also respectively include gate electrode layers 160-162 that are respectively disposed over the gate dielectric layers 150-152. The gate electrode layers 160-162 each include polysilicon. In addition, although not illustrated in FIGS. 3A-3B for purposes of simplicity, gate spacers may be formed on sidewalls of the gate structures 140-142, and the gate structures 140-142 may include respective hard mask layers that are disposed over the gate electrode layers 160-162.

A source region 170 and a drain region 171 are also formed in the substrate portion 45B on either side of the gate structure 142. The source region 170 and the drain region 170 are each doped with an N-type dopant such as arsenic or phosphorous, since the substrate portion 45B is doped with a P-type dopant. In an alternative embodiment where the substrate portion 45B is doped with an N-type dopant, the source region 170 and the drain region 171 may be doped with a P-type dopant. The source and drain regions 170 and 171 may each include a lightly doped region and a heavily doped region. The source and drain regions 170 and 171 are separated by a channel region 175 in the substrate portion 45B. The channel region 175 is disposed below the gate structure 142 and may constitute a conductive path for the flow of electrical current. The gate structure 142, the source region 170, the drain region 171, and the channel region 175 are each a portion of the MOS transistor device 130.

Figure 4A:
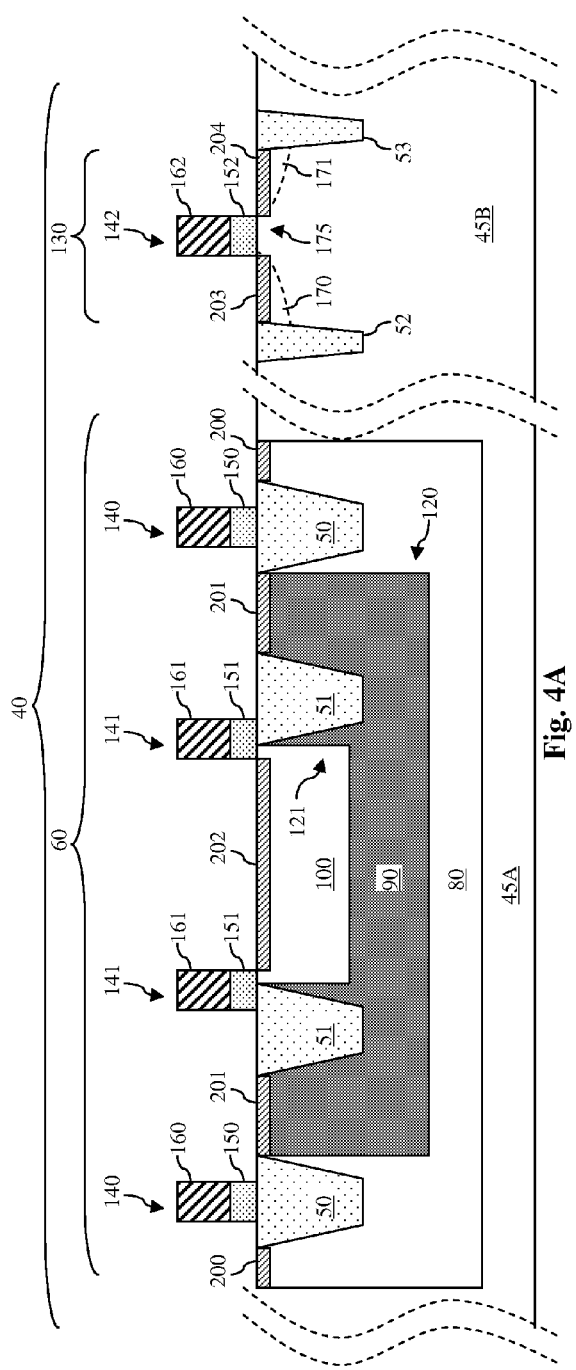
Figure 4B:
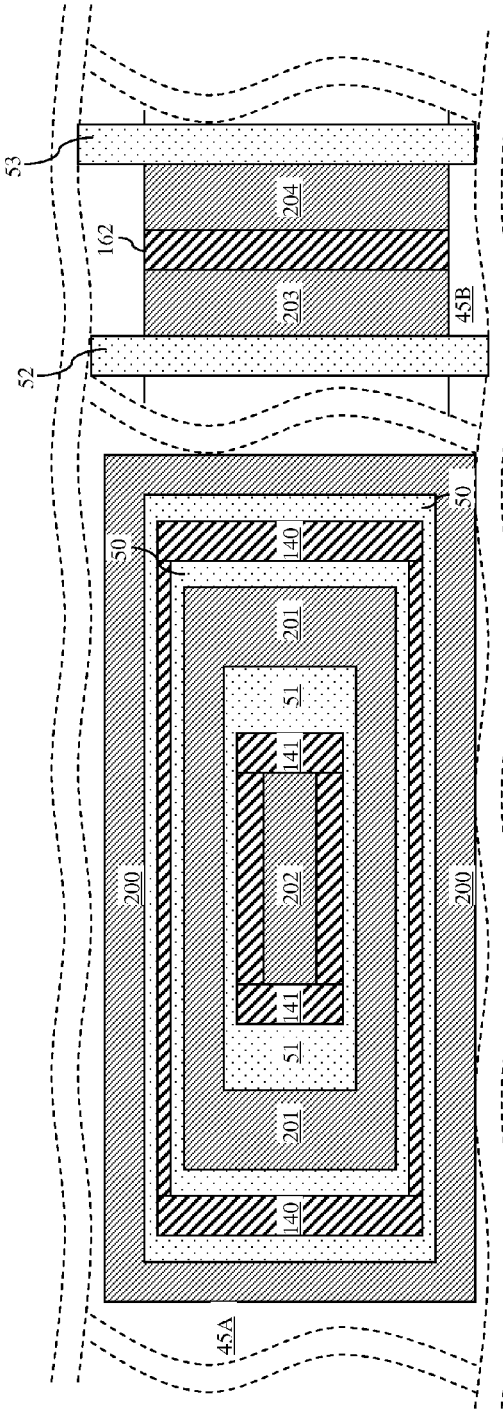

Referring now to FIGS. 4A and 4B, silicide layers 200-204 are respectively formed on exposed surfaces of the substrate 45 including the collector region 80, the base region 90, the emitter region 100, the source region 170, and the drain region 171. No silicide is formed on the gate structures 140-142 since they are protected by their respective hard mask layers (not illustrated). The silicide layers 200-204 have a relatively high conductivity and may be used to form electrical contacts. As illustrated in FIG. 4A, the gate structure 141 prevents the formation of the silicide layer 202 over the interface 121 between the emitter region 100 and the based region 90. In other words, no silicide is formed near edges of the emitter region 100. It may be desired to have the edges of the emitter region 100 to be silicide-free for reasons that include, for example, fabrication processes that may result in some gaps between the emitter region 100 and the isolation structure 51. If the gate structure 141 (or a functionally equivalent silicide blocking layer) is not formed near the edges of the emitter region 100, the silicide layer may extend into such gaps and possibly short the emitter region and the base region. Consequently, a junction leakage defect may occur. The junction leakage problem may be exacerbated when a relatively high voltage bias is applied to the emitter region 100 during operation.

Traditional methods have formed a resist-protection oxide (RPO) layer to prevent the silicide formation near the edges of the emitter region 100. However, forming the RPO layer requires an additional fabrication process and thus increases fabrication costs. Furthermore, as transistor sizes continue to shrink, it may be difficult to form the RPO layer so that it is accurately aligned with the edges of the emitter region 100, and not cover other regions of the bipolar transistor device 60. The need for accurate alignment may place additional burdens and demands on fabrication tools, including lithography tools.

In comparison, the embodiment illustrated in FIGS. 2-4 offers several advantages, it being understood that different embodiments may offer different advantages, and that no particular advantage is required for all embodiments. One advantage is that the gate structure 141 is formed through the same fabrication process that forms the gate structure 142 of the MOS transistor device 130. As such, no extra fabrication process is undertaken to form the gate structure 141, thereby reducing fabrication costs. Another advantage is more accurate alignment. In semiconductor fabrication, the lithography tools used to form gate structures (for example, the gate structures 141 and 142) typically offer the most alignment and overlay accuracy and precision and can achieve better performance compared to lithography tools used in other fabrication processes. This is partially due to the fact that gate structures are one of the most essential components of a MOS transistor device (such as the MOS transistor device 130), and that accurate alignment or overlay between the gate structure and other parts of the MOS transistor device may be crucial for the successful fabrication and operation of the MOS transistor device. Therefore, since the gate structure 141 is formed using the same lithography process and the same lithography tools that form the gate structure 142, the gate structure 141 may be more accurately aligned with a desired silicide-free region underneath. Still another advantage is that the formation of gate structures 140 and 141 may reduce a chemical mechanical polishing (CMP) dishing effect. A CMP process will be performed on the semiconductor device 40 (which includes the bipolar transistor device 60 and the MOS transistor device 130) in a later fabrication stage. For the CMP process, the rate of polishing varies depending on the type of material that is being polished. Thus, the rate of polishing near the gate structure 142 may be different than the rate of polishing elsewhere. Consequently, had the gate structures 140 and 141 not been formed, the CMP process may result in uneven (or not flat) surfaces of the semiconductor device 40, which is undesirable. Here, by implementing the gate structures 140-141, which all include similar types of materials as the gate structure 142, the rate of polishing is more evenly distributed throughout the semiconductor device 40, and thus the CMP dishing effect is substantially reduced.

It is understood that additional processes may be performed to complete the fabrication of the semiconductor device 40. For example, the gate electrode layer 162 may be removed and replaced with a metal gate electrode layer in accordance with a high-k metal gate fabrication process. In one embodiment, the gate dielectric layer 152 is removed along with the gate electrode layer 162, and a high-k gate dielectric layer is formed thereafter to replace the gate dielectric layer 152. This approach may be referred to as a high-k last approach. In another embodiment, the gate dielectric layer 152 already includes a high-k material, and thus is not removed along with the gate electrode layer 162. Under this approach, no additional high-k gate dielectric layer needs to be formed, and this approach may be referred to as a gate-last approach.

Meanwhile, the gate structures 140 and 141 may or may not undergo the gate replacement processes for the gate structure 142. In an embodiment, the gate structures 140 and 141 are protected as the gate structure 142 is replaced. In another embodiment, the gate structures 140 and 141 are replaced by gate structures that have material compositions similar to the gate structure that replaces the gate structure 142. In other words, the gate structures replacing the gate structures 140 and 141 would have high-k dielectric layers and metal gate electrode layers.

In embodiments where the gate structures 140 and 141 are replaced with gate structures having metal gate electrode layers, another advantage is offered, in addition to the other advantages associated with the embodiment discussed above with reference to FIGS. 2-4. The metal gate electrode layers each include a work function metal portion that may be an N-type work function metal or a P-type work function metal. The N-type work function metal portion may include Ti, Al, Ta, $ZrSi_2$, TaN, or combinations thereof. The P-type work function metal portion may include Mo, Ru, Jr, Pt, PtSi, MoN, WNx, or combinations thereof. A work function value is associated with the material composition of the work function metal portions. Thus, each work function metal portion may be chosen to tune its work function value so that a desired threshold voltage $V_t$ is achieved. The threshold voltage $V_t$ may be tuned to have a relatively high voltage value so as to reduce potential voltage coupling caused by the bias voltage applied to the emitter region 100. Stated differently, the gate structures replacing the gate structures 140 and 141 may be designed and implemented to have a threshold voltage that may better withstand voltage coupling problems caused by the high bias voltage at the emitter region 100.

As mentioned above, the gate structures 140-142 serve as dummy gates. In particular, the gate structure 142 serves as a dummy gate in the sense that it is eventually replaced by a gate structure having a metal gate electrode. In embodiments where the gate replacement occurs for the gate structures 140 and 141, the gate structures 140 and 141 serve as dummy gates in that sense as well. Further, the gate structures 140 and 141 also serve as dummy gates in the sense that they are not the gates of a MOS transistor device. Instead, the purposes of the gate structures 140 and 141 include preventing silicide formation near the edges of the emitter region 100 as well as reducing a CMP dishing effect.

Other additional processes may include annealing processes to activate the source and drain regions 170 and 171, deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the bipolar transistor device may not be limited to an NPN device and can be extended to a PNP device with a similar structure and configuration except that all doping types may be reversed and dimensions are modified according to the PNP design. Similarly, the MOS transistor device may be implemented as a PMOS device as opposed to an NMOS device.

What is claimed is:

1. A semiconductor device, comprising a transistor that includes:
   a substrate;
   a collector region disposed in a portion of the substrate;
   a base region surrounded by the collector region;

an emitter region surrounded by the base region;
an isolation structure disposed adjacent to the emitter region and within the base region; and
a gate structure disposed over a portion of the emitter region and a portion of the isolation structure, wherein the gate structure includes a gate electrode, and wherein the gate electrode is free of being in contact with the emitter region.

2. The semiconductor device of claim 1, wherein the semiconductor device further includes a further transistor that includes:
   a source region, a drain region, and a channel region each disposed in a further portion of the substrate, the source region and drain region being separated by a channel region; and
   a further gate structure disposed over the channel region.

3. The semiconductor device of claim 1, wherein the isolation structure surrounds the emitter region and is surrounded by the base region, and wherein the transistor further includes:
   a further isolation structure that surrounds the base region and is surrounded by the collector region; and
   a further gate structure that is disposed over the further isolation structure.

4. The semiconductor device of claim 1, wherein the gate structure includes a high-k gate dielectric layer and a metal gate electrode layer.

5. The semiconductor device of claim 1, wherein the gate structure includes an oxide gate dielectric layer and a polysilicon gate electrode layer.

6. The semiconductor device of claim 1, wherein the portion of the emitter region that the gate structure is disposed over is a first portion of the emitter region, wherein the emitter region has a second portion that is different from the first portion and that has a silicide layer formed thereon.

7. A semiconductor device, comprising a bipolar transistor that includes:
   a collector portion formed in a portion of a substrate;
   a base portion formed in the collector portion;
   an emitter portion formed in the base portion;
   an isolation structure formed in the base portion, the isolation structure being formed proximate to the emitter portion such that a gap exists between the isolation structure and the emitter portion; and
   a gate structure formed over the gap, over the emitter portion, and over the isolation structure, the gate structure including a gate electrode and a gate dielectric,
   wherein the gate electrode is spaced apart from the emitter portion and the isolation structure.

8. The semiconductor device of claim 7, wherein the semiconductor device further includes a metal-oxide semiconductor (MOS) transistor that includes:
   a further gate structure formed over a further portion of the substrate; and
   a source and a drain formed in the further portion of the substrate, the source and drain being formed at either side of the further gate structure;
   wherein the further gate structure includes a high-k gate dielectric layer and a metal gate electrode layer.

9. The semiconductor device of claim 7, wherein the isolation structure surrounds the emitter portion and is surrounded by the base portion, and wherein the bipolar transistor further includes:
   a further isolation structure that surrounds the base portion and is surrounded by the collector portion; and
   a further gate structure that is formed over the further isolation structure.

10. The semiconductor device of claim 7, wherein the bipolar transistor includes a silicide layer formed over a region of the emitter portion that is not covered by the gate structure, and wherein the gate structure includes:
    a gate dielectric layer having one of a high-k dielectric material and an oxide material; and
    a gate electrode layer having one of a metal material and a polysilicon material.

11. A method of fabricating a semiconductor device, comprising:
    providing a substrate;
    forming a collector region in a portion of the substrate;
    forming a base region in the collector region;
    forming an emitter region in the base region;
    forming an isolation structure adjacent to the emitter region and within the base region, wherein a gap exists between the isolation structure and the emitter region; and
    forming a gate structure over the gap, the forming of the gate structure including:
        forming a gate dielectric over the gap, a portion of the emitter region, and a portion of the isolation structure; and
        forming a gate electrode over the gate dielectric, the gate electrode being electrically insulated from the emitter region.

12. The method of claim 11, further including:
    forming a source region and a drain region over a further portion of the substrate, the source region and drain region being separated by a channel region; and
    forming a further gate structure over the channel region.

13. The method of claim 12, wherein the forming the further gate structure includes forming a high-k gate dielectric layer and forming a metal gate electrode layer over the high-k gate dielectric layer.

14. The method of claim 11, wherein the forming the isolation structure is carried out in a manner so that the isolation structure surrounds the emitter region and is surrounded by the base region.

15. The method of claim 14, further including:
    forming a further isolation structure over the substrate, the forming the further isolation structure being carried out in a manner so that the further isolation structure surrounds the base region and is surrounded by the collector region; and
    forming a further gate structure over the further isolation structure.

16. The method of claim 11, wherein the forming the gate structure is carried out in a manner so that the gate structure includes a high-k gate dielectric layer and a metal gate electrode layer.

17. The method of claim 11, wherein the forming the gate structure is carried out in a manner so that the gate structure includes an oxide gate dielectric layer and a polysilicon gate electrode layer.

18. The method of claim 11, further including forming a silicide layer over a portion of the emitter region that is not covered by the gate structure.

19. The semiconductor device of claim 1, wherein the gate structure further includes a gate dielectric disposed between the gate electrode and the emitter region.

20. The semiconductor device of claim 1, wherein the gate electrode is electrically isolated from the emitter region.

* * * * *